US010500847B2

(12) United States Patent
Nitta et al.

(10) Patent No.: US 10,500,847 B2
(45) Date of Patent: Dec. 10, 2019

(54) LIQUID EJECTING HEAD AND LIQUID EJECTING DEVICE

(71) Applicant: TOSHIBA TEC KABUSHIKI KAISHA, Tokyo (JP)

(72) Inventors: Noboru Nitta, Tagata Shizuoka (JP); Ryutaro Kusunoki, Mishima Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/933,780

(22) Filed: Mar. 23, 2018

(65) Prior Publication Data

US 2018/0272703 A1 Sep. 27, 2018

(30) Foreign Application Priority Data

Mar. 24, 2017 (JP) ................................ 2017-059948

(51) Int. Cl.

| | |
|---|---|
| ***B41J 2/045*** | (2006.01) |
| ***B41J 2/18*** | (2006.01) |
| ***B41J 2/14*** | (2006.01) |
| ***B41J 2/17*** | (2006.01) |
| ***B41J 2/175*** | (2006.01) |
| ***B41J 29/393*** | (2006.01) |
| *H01L 41/04* | (2006.01) |

(52) U.S. Cl.

CPC ....... *B41J 2/04563* (2013.01); *B41J 2/04581* (2013.01); *B41J 2/14* (2013.01); *B41J 2/14201* (2013.01); *B41J 2/17* (2013.01); *B41J 2/17546* (2013.01); *B41J 2/18* (2013.01); *B41J 29/393* (2013.01); *B41J 2002/14491* (2013.01); *B41J 2202/12* (2013.01); *H01L 41/04* (2013.01)

(58) Field of Classification Search

CPC ............................ B41J 2/14072; B41J 2/1408

See application file for complete search history.

(56) References Cited

U.S. PATENT DOCUMENTS 5,006,867 A * 4/1991 Koizumi .................. B41J 2/195 347/17
8,876,243 B2 11/2014 Nitta
2006/0152541 A1* 7/2006 Isozaki ................ B41J 2/04528 347/17
2007/0120884 A1* 5/2007 Lecheheb ............ B41J 2/04515 347/17

(Continued)

FOREIGN PATENT DOCUMENTS

JP 6220798 B2 10/2017

OTHER PUBLICATIONS

U.S. Appl. No. 15/928,698, filed Mar. 22, 2018 (First Inventor: Noboru Nitta).

*Primary Examiner* — Shelby L Fidler
(74) *Attorney, Agent, or Firm* — Kim & Stewart LLP

(57) ABSTRACT

A liquid ejecting head includes an actuator communicating with a nozzle, configured to eject liquid from the nozzle, a drive circuit on a circuit board configured to drive the actuator, a flow path of liquid circulating, a first temperature sensor configured to measure a temperature on a surface on the circuit board proximate to the drive circuit, and a second temperature sensor configured to measure a temperature of a liquid on the flow path of liquid circulating.

7 Claims, 6 Drawing Sheets

(56) References Cited

U.S. PATENT DOCUMENTS

| | | | | |
|---|---|---|---|---|
| 2009/0322818 | A1* | 12/2009 | Iwasaki | B41J 2/175 347/14 |
| 2010/0245424 | A1* | 9/2010 | Yamashita | B41J 2/0451 347/10 |
| 2010/0309244 | A1* | 12/2010 | Yamada | B41J 2/0456 347/17 |

* cited by examiner

LIQUID EJECTING HEAD AND LIQUID EJECTING DEVICE

CROSS-REFERENCE TO RELATED APPLICATION

This application is based upon and claims the benefit of priority from Japanese Patent Application No. 2017-059948, filed on Mar. 24, 2017, the entire contents of which are incorporated herein by reference.

FIELD

Embodiments described herein related generally to a liquid ejecting head and a liquid ejecting device.

BACKGROUND

In an existing liquid ejecting device, a temperature of liquid to be ejected or a temperature of an actuator for ejecting the liquid is measured and the liquid ejection device can be controlled based on the measured temperature. One example of a liquid ejecting device is a circulation-type liquid ejecting device in which liquid is circulated along a circulation path passing through a liquid ejecting head and a liquid storage tank. The actuator that drives the liquid ejecting head to eject liquid generates heat according to a driving frequency, and the generated heat causes the temperature of the liquid in the circulation path to rise. In such a circulation-type liquid ejecting device, heated liquid in the vicinity of the actuator will be naturally cooled as the liquid passes through the liquid tank or other portions along the circulation path, thus it is relatively easy to stabilize the temperature of the ink in the vicinity of the actuator. Alternatively, the ink may be purposively heated or cooled in the liquid storage tank or elsewhere to adjust viscosity. The liquid may be cooled such that its viscosity at ejection is stabilized. That is, in the circulation type liquid ejecting device, the temperature of the liquid may be adjusted regardless of the drive frequency of the actuator and a difference between the temperature of the actuator and the drive circuit may be large. For this reason, it can be difficult to determine the temperature of the drive circuit for an appropriate control the liquid ejecting device solely by detecting the temperature of the liquid.

DETAILED DESCRIPTION

In general, according to one embodiment, a liquid ejecting head includes an actuator communicating with a nozzle, configured to eject liquid from the nozzle, a drive circuit on a circuit board configured to drive the actuator, a flow path of liquid circulating, a first temperature sensor configured to measure a temperature on a surface on the circuit board proximate to the drive circuit, and a second temperature sensor configured to measure a temperature of a liquid on the flow path of liquid circulating.

Hereinafter, a configuration of a liquid ejecting device 1 according to embodiments will be described with reference to FIGS. 1 to 7. It should be noted that the drawings are schematic and are drawn with exaggeration and omissions for purposes of explanatory convenience. In general, components are not drawn to scale. In addition, the number of components, the dimensional ratio been different components, or the like does not necessarily match between different drawings or to actual devices.

Figure 1:
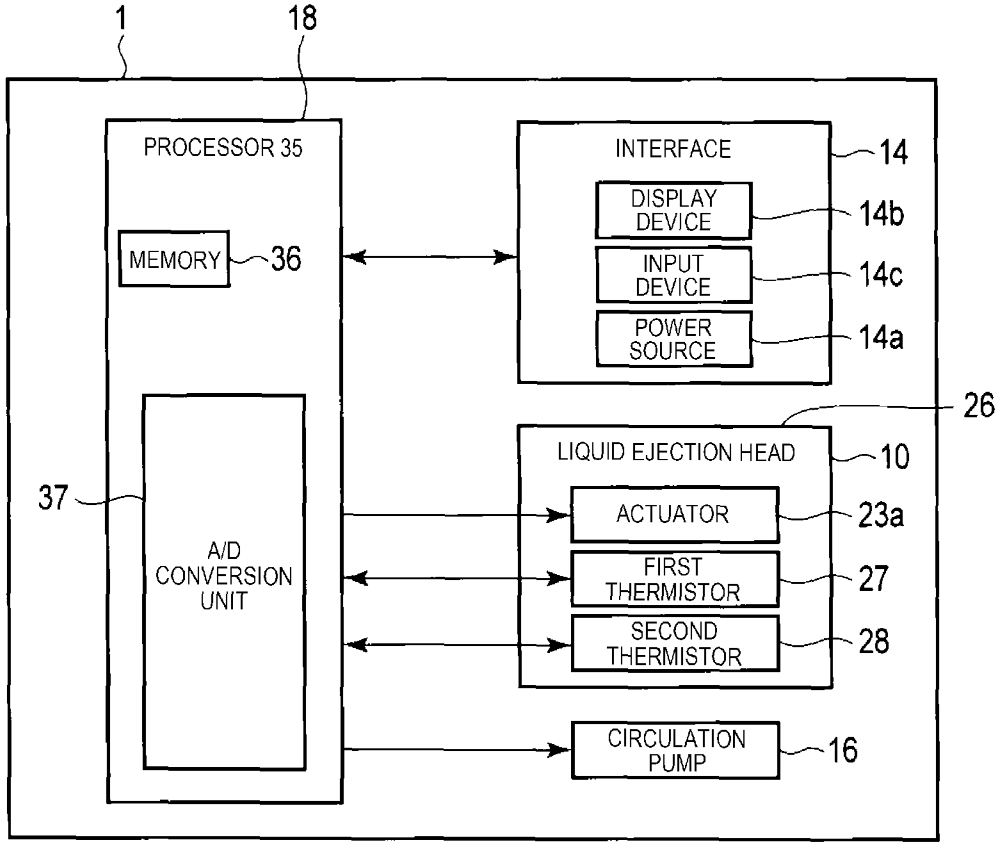
FIG. 1 is a block diagram of a liquid ejecting device according to one embodiment.
Figure 2:
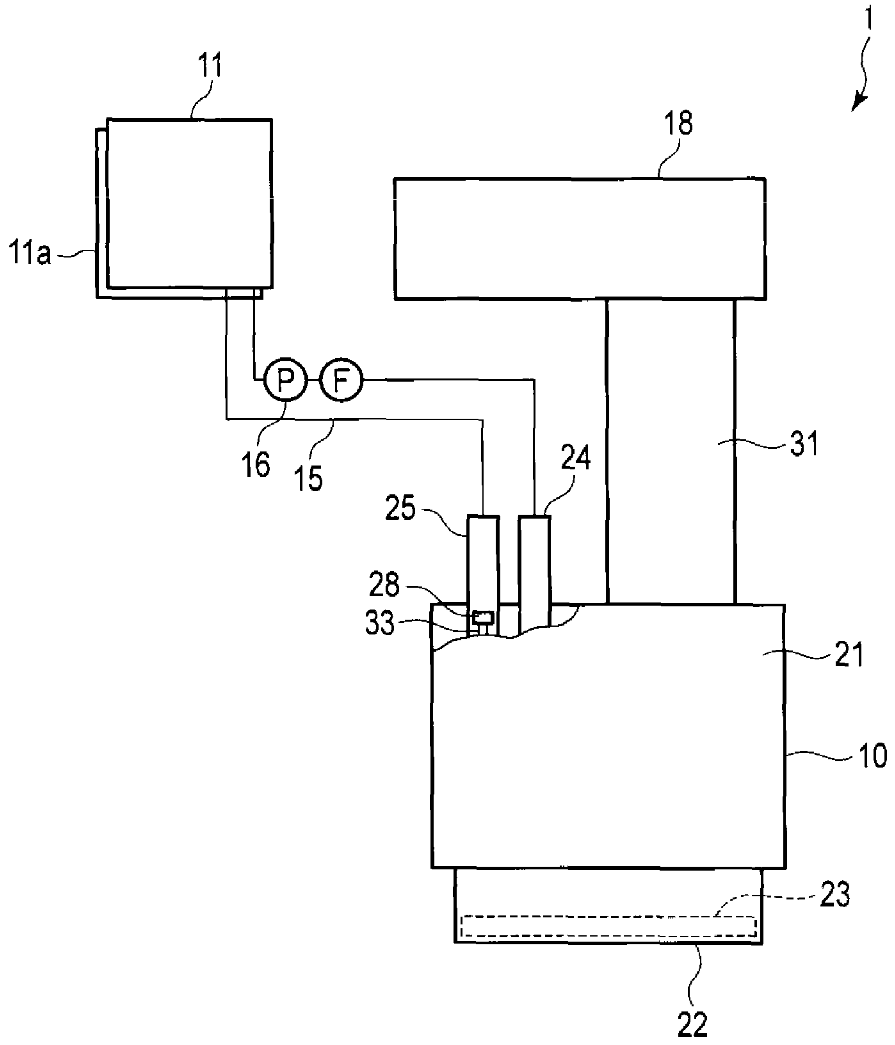
FIG. 2 is an explanatory view of a liquid ejecting head.
Figure 3:
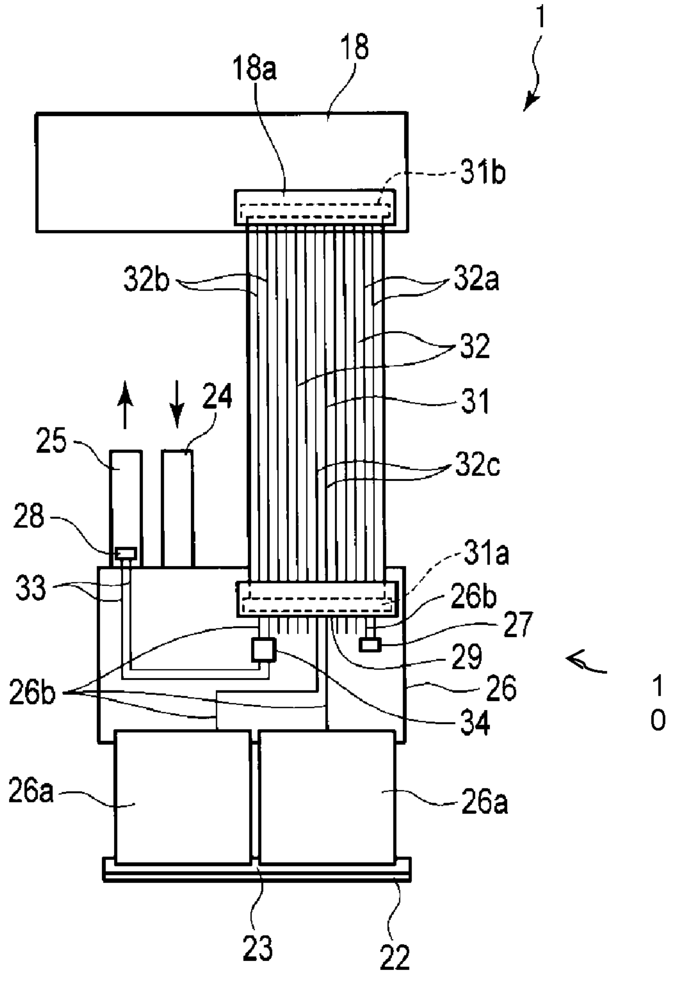
FIG. 3 is explanatory plan view of an internal configuration of a liquid ejecting head.
Figure 4:
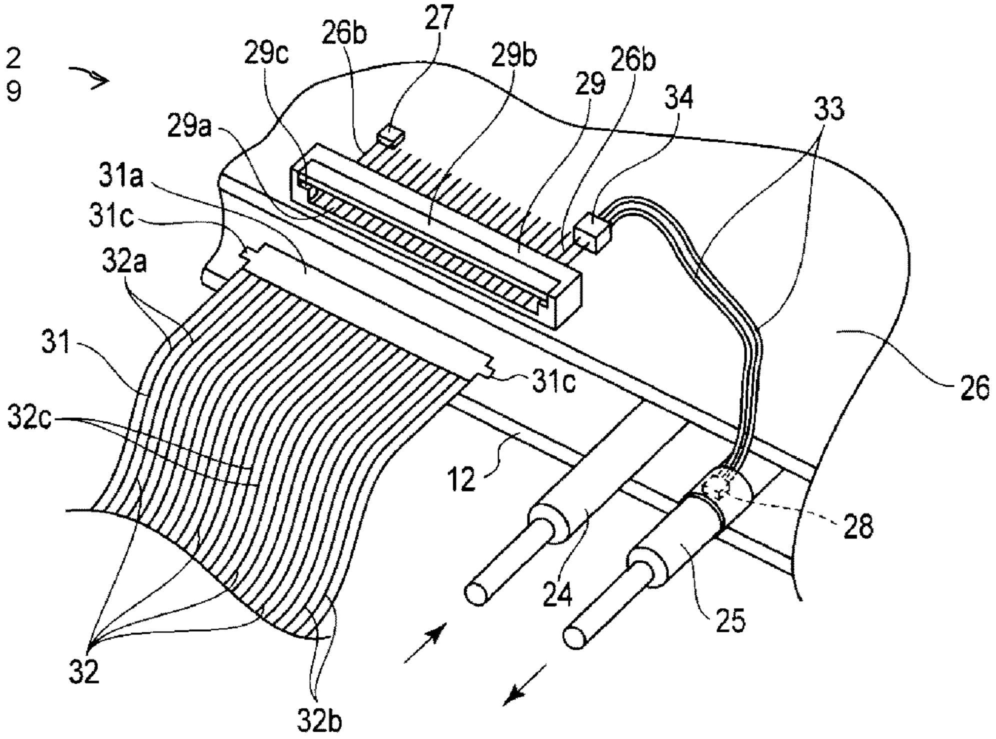
FIG. 4 is an enlarged perspective view of a liquid ejecting head.
Figure 5A:
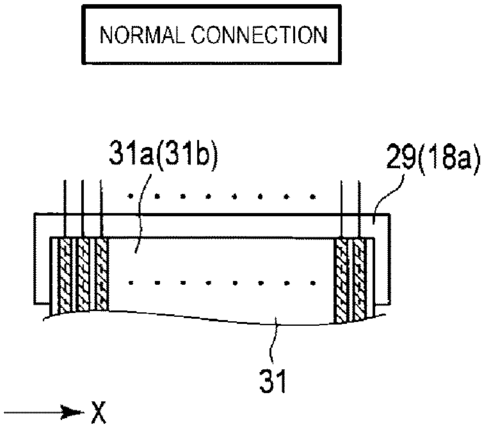
FIGS. 5A and 5B are explanatory views showing connection states of a liquid ejecting head.
Figure 5B:
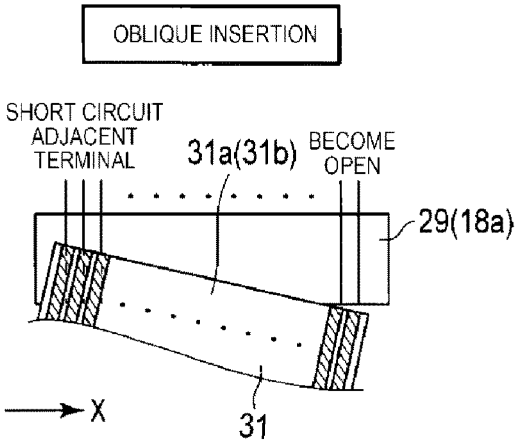
Figure 6:
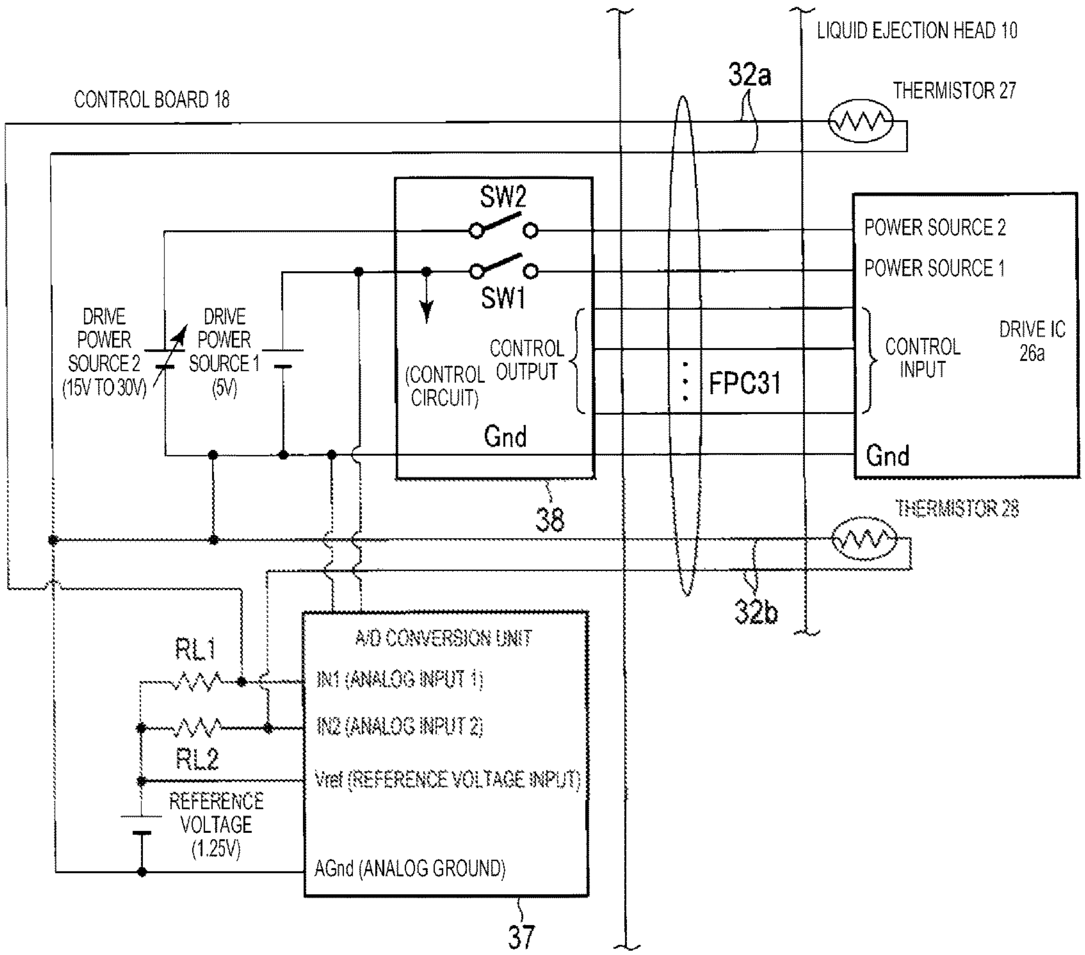
FIG. 6 is a circuit diagram of a liquid ejecting device.
Figure 7:
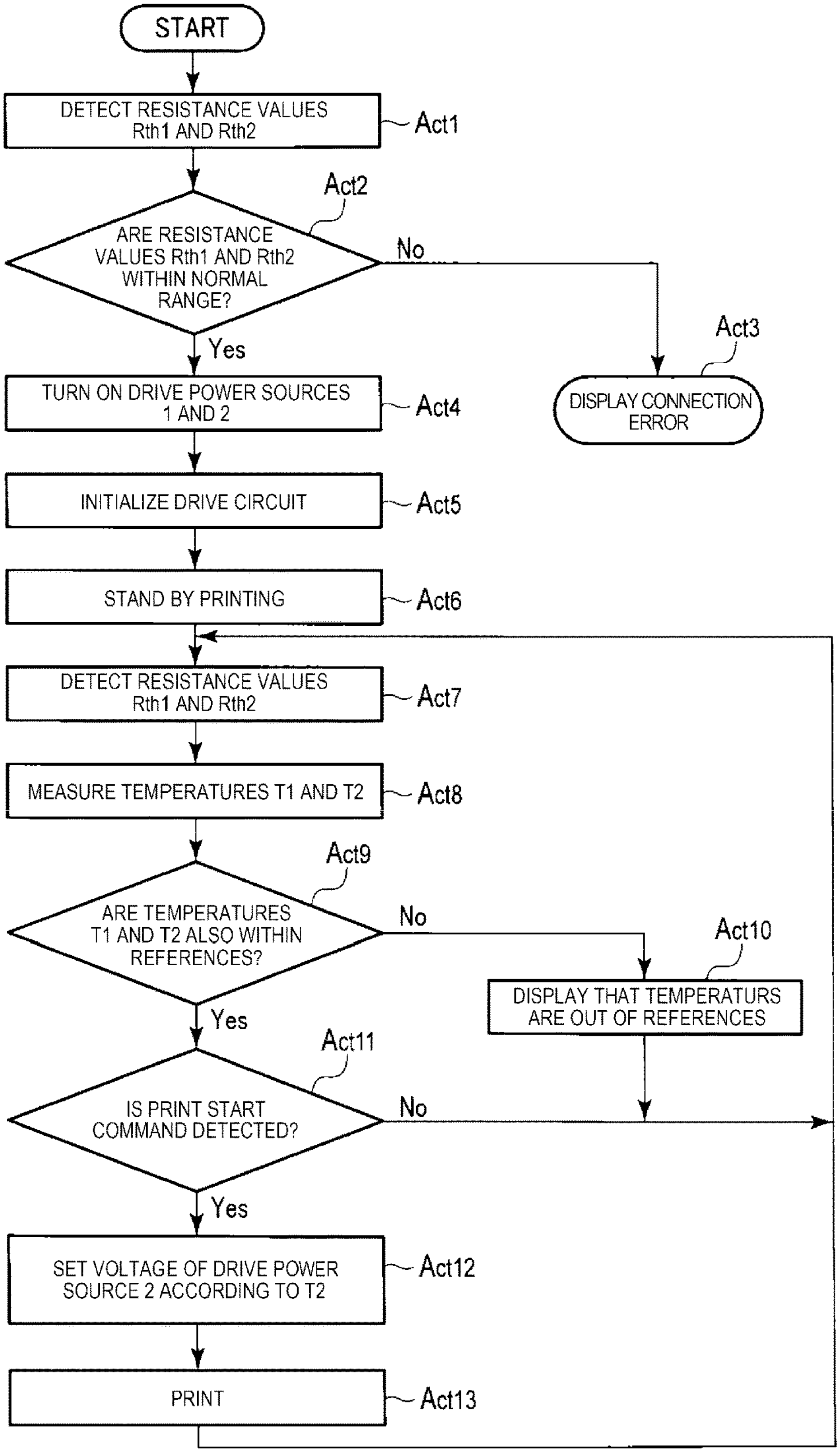
FIG. 7 is a flowchart of a control method of a liquid ejecting device.

FIG. 1 is a block diagram of the liquid ejecting device 1. FIG. 2 is an explanatory view of the liquid ejecting device 1. FIG. 3 is a plan view of an internal structure of a liquid ejecting head 10. FIG. 4 is an enlarged perspective view of the liquid ejecting head 10. FIGS. 5A and 5B are explanatory views showing connection states of the liquid ejecting head 10. FIG. 6 is a circuit diagram of the liquid ejecting device 1. FIG. 7 is a flowchart of a control method of the liquid ejecting device 1.

The liquid ejecting device 1 includes a liquid ejecting head 10 that ejects liquid, an ink tank 11 which stores liquid to be supplied to the liquid ejecting head 10, a circulation pump 16 for circulating ink in a circulation path 15 passing through the liquid ejecting head 10 and the ink tank 11, a control board 18 connected to the liquid ejecting head 10 via a wiring connection body 31, such as a flexible printed circuit (FPC), and an interface unit 14. Further, the liquid ejecting device 1 includes a moving mechanism that transports a recording medium, such as a sheet of paper, along a transportation path including a printing position opposed to the liquid ejecting head 10, a maintenance device that performs maintenance of the liquid ejecting head 10, various sensors, and an adjusting device.

The liquid ejecting head 10 is a circulation-type head and connected to the ink tank 11. Ink circulates in the circulation path 15 passing through the liquid ejecting head 10 and the ink tank 11. The liquid ejecting head 10 ejects, for example, ink as liquid, thereby forming a desired image on the recording medium disposed opposite to the liquid ejecting head 10. The ink tank 11 stores liquid such as ink and communicates with the liquid ejecting head 10. The ink tank 11 includes, for example, a temperature control device **11*a* including a heat radiation fin, a heater, a heat exchange module, and the like. The temperature control device 11*a* heats or cools the ink in the ink tank 11**.

The liquid ejecting head 10 includes a housing 21, a nozzle plate 22 having a plurality of nozzle holes, an actuator unit 23, a supply pipe 24, a collection pipe 25, a circuit board 26 on which a drive circuit **26*a* is mounted, a first thermistor (also referred to as a first temperature sensor) 27, and a second thermistor (also referred to as a second temperature sensor) 28. In the example embodiments described herein, the liquid ejecting head 10 includes the nozzle plate 22 having a plurality of nozzle holes and the actuator unit 23**.

The nozzle plate 22 is formed in a rectangular plate shape and supported by the housing 21. The nozzle plate 22 has a plurality of nozzle holes arranged in lines. Liquid can be ejected an ejecting surface of the nozzle plate 22.

The actuator unit 23 is disposed on a surface opposite to the ejecting surface of the nozzle plate 22 and is supported by the housing 21. The actuator unit 23 includes a plurality of pressure chambers in fluid communication with the nozzle holes of the nozzle plate 22 and a common chamber in fluid communication with the plurality of pressure chambers. An actuator 23*a* is provided in a portion facing each pressure chamber. The actuator 23*a* includes, for example, a unimorph-type piezoelectric diaphragm in which a piezoelectric element and a diaphragm are laminated. The piezoelectric element is formed of a piezoelectric ceramic material such as PZT (lead zirconate titanate) or the like. An electrode is formed facing the pressure chamber and electrically connected to the drive circuit 26*a*.

Each of the supply pipe 24 and the collection pipe 25 include a pipe formed of a metal or other thermally conductive material and a tube covering the outer surface of the pipe, for example, a PTFE tube. Liquid flows in the liquid ejecting head 10 through the actuator unit 23, the supply pipe 24, and the collection pipe 25.

The supply pipe 24 is a tube that communicates with the upstream side of the common chamber of the actuator unit 23 and forms a flow path communicating with the ink tank 11. By the operation of the circulation pump 16, the liquid in the ink tank 11 is sent to the actuator unit 23 through the supply pipe 24.

The collection pipe 25 is a tube that communicates with the downstream side of the common chamber of the actuator unit 23 and forms another flow path communicating with the ink tank 11. By the operation of the circulation pump 16, the liquid is sent from the common chamber through the collection pipe 25 to the ink tank 11. The second thermistor 28 is mounted on the outer peripheral surface of the collection pipe 25. The second thermistor 28 measures the temperature of the ink passing through the collection pipe 25 via the thermally conductive collection pipe 25.

The circuit board 26 is provided on the side surface of the liquid ejecting head 10, for example, and is fixed to the housing 21. The drive circuit 26*a* is mounted on the circuit board 26 and a wiring pattern 26*b* is provided. The drive circuit 26*a* is electrically connected to the electrode of the actuator 23*a*.

A first FPC connector 29 for FPC 31 is mounted in a portion on the circuit board 26. The first FPC connector 29 includes a slit-shaped insertion slot 29*a* into which a fitting terminal portion 31*a* at one end of the FPC 31 for connection with the control board 18 may be inserted and a holding lid 29*b* that holds the fitting terminal portion 31*a* inserted in the insertion slot 29*a*. In the insertion slot 29*a*, a plurality of connection terminals connected to a plurality of signal lines 32 of the fitting terminal portion 31*a* are disposed in parallel in the X direction. A regulating projection 29*c* for regulating a positional relationship with the fitting terminal portion 31*a* is provided at both end portions in the width direction of the insertion slot 29*a* having a fixed width in the X direction.

The first FPC connector 29 is configured to fix and connect the fitting terminal portion 31*a* of the corresponding FPC 31. The holding lid 29*b* is configured to open and close the insertion slot 29*a* by the pivotal motion and to hold or release the fitting terminal portion 31*a*. The fitting terminal portion 31*a* of the FPC 31 is inserted into the insertion slot 29*a* of the first FPC connector 29 and the holding lid 29*b* is covered and pressed from above, thus the signal line 32 of the FPC 31 and the connection terminal of the first FPC connector 29 are electrically connected to each other and the control board 18 and the circuit board 26 are electrically and mechanically connected via the FPC 31.

On the circuit board 26, the first thermistor 27 (also referred to as the first temperature sensor) is provided near the connector for FPC 29.

The first thermistor 27 is a chip component and is mounted directly on the surface of the circuit board 26. For example, the first thermistor 27 is disposed in the vicinity of one end of the first FPC connector 29 and is electrically connected to a connection terminal to be disposed on one end side of the first FPC connector 29 on the circuit board 26 by, for example, the wiring pattern 26*b*. The first thermistor 27 measures the temperature inside the housing 21. The first thermistor 27 is disposed closer to the drive circuit 26*a* than the second thermistor 28.

The second thermistor 28 is joined to the outer surface of the collection pipe 25 provided in the flow path and is electrically connected to the connection terminal disposed on the other end side of the first FPC connector 29 on the circuit board 26 by the signal cable 33. Specifically, one end of the signal cable 33 is joined to the second thermistor 28, and the other end is connected to the connection terminal at the other end of the first FPC connector 29 in the X direction by the thermistor connector 34. The second thermistor 28 is provided in the flow path on the downstream side of the actuator 23*a* and measures the temperature of the liquid after pas sing through the actuator 23*a*. The thermistor connector 34 is, for example, a connector dedicated to a 2-pin thermistor, and is mounted on the circuit board 26. The thermistor connector 34 is connected to the first FPC connector 29 via the wiring pattern 26*b*.

The first thermistor 27 and the second thermistor 28 are negative temperature coefficient (NTC) thermistors, having resistors in which the resistance decreases with increasing temperature, and characterized by, for example, a beta (B) constant 3435 K and a resistance at 25° C. (R25)=10 kΩ.

The FPC 31 is, for example, a band-shaped or ribbon-shaped wiring board having flexibility and a certain width, and includes a plurality of signal lines 32 which are wirings extending along the longitudinal direction thereof. The FPC 31 includes fitting terminal portions 31*a* and 31*b* at both ends along the longitudinal direction thereof, respectively. The plurality of signal lines 32 of the FPC 31 are arranged in parallel across a width direction orthogonal to the longitudinal direction. The FPC 31 is a flexible board having a copper foil patterned on a copper-clad polyimide film and a pattern portion excluding fitting terminal portions 31*a* and 31 *b* laminated with a film. One fitting terminal portion 31*a* of the FPC 31 is to be inserted into (electrically and mechanically connected to) the connector for FPC 29, and the signal line 32 is thereby connected to the connection terminal. The fitting terminal portion 31*a* includes regulating pieces 31*c* positioned on both width direction edges thereof to be engaged with the regulating projection 29*c*.

The other fitting terminal portion 31*b* of the FPC 31 is to be connected to a control-side FPC connector 18*a* (also referred to as a second FPC connector 18*a*)) mounted on the control board 18. The structure and function of the control-side FPC connector 18*a* are the same as those of the connector for FPC 29.

Among the signal lines 32 of the FPC 31, two adjacent signal lines 32*a* on one end side in the width direction are connected to the first thermistor 27 via the connection terminal of the first FPC connector 29 and the wiring pattern 26*b*. In addition, two adjacent signal lines 32*b* disposed at the other end of the signal line 32 in the width direction are connected to the second thermistor 28 via the connector for FPC 29, the thermistor connector 34, and the signal cable 33. That is, as shown in the circuit diagram of FIG. 6, among the plurality of signal lines 32, the signal lines 32*a* and 32*b* at both ends in the width direction of the FPC 31 and the terminals at one end and the other end of the fitting terminal portion 31*a* of the FPC 31 are allocated for the first thermistor 27 and the second thermistor 28, respectively. Any signal line 32*c* of the plurality of signal lines 32 disposed in the central portion between two signal lines 32*a* and 32*b* at each of both ends of the signal lines 32*a* and 32*b* is assigned as a power source and a signal line of the drive circuit 26*a*, respectively.

As shown in the circuit diagram of FIG. 6, a reference voltage Vref of the AD conversion used for detecting the resistance of the first thermistor 27 and the second thermistor 28 is made independent of the power source applied to the drive circuit 26*a* of the liquid ejecting head 10. As a result, the reference voltage Vref for AD conversion may be a low-voltage and high-impedance power source.

The circulation pump 16 includes a piezoelectric pump, for example. The piezoelectric pump is configured to be controllable under the control of a processor 35 provided in the control board 18. The circulation pump 16 sends the liquid of the circulation path 15 to the downstream side via a filter.

The interface unit 14 includes a power source 14*a*, a display device 14*b*, and an input device 14*c*. The interface unit 14 is connected to a processor 35. The interface unit 14 instructs the processor 35 various operations by operating the input device 14*c* by a user. In addition, the interface unit 14 displays various kinds of information and images on the display device under the control of the processor 35.

The control board 18 includes a processor 35 that controls the operation of each unit, a memory 36 which stores a program or various data and the like, an analog-to-digital (A/D) conversion circuit 37 that converts an analog voltage value into a digital data, control circuit 38 that control to drive the drive circuit 26*a*. As shown in FIG. 6, the A/D conversion circuit 37 includes an analog input 1IN1, an analog input 2IN2, the reference voltage input Vref, and an analog ground AGnd. A drive power source 1 also serves as an operating power source of the control circuit 38 and an operating power source of the A/D conversion circuit 37. The outputs of the first thermistor 27 and the second thermistor 28 are pulled up toward the reference voltage Vref via a load resistance RL1 and a load resistance RL2, respectively. That is, a voltage obtained by dividing the reference voltage input Vref by the first thermistor 27 and the load resistance RL1 is input to the analog input 1IN1, and a voltage obtained by dividing the reference voltage input Vref by the second thermistor 28 and the load resistance RL2 is input to the analog input 2IN2. Here, assuming that the load resistors RL1 and RL2 and the voltages detected by the A/D conversion circuit 37 are $P1 \cdot Vref$ and $P2 \cdot Vref$, resistance values Rth1 and Rth2 of the thermistors are $Rth1=\{P1/(1-P1)\}\cdot RL1$ and $Rth2=\{P2/(1-P2)\}\cdot RL2$ from $Rth/(Rth+RL)=P$. In FIG. 6, for example, the load resistance RL1=RL2=10 kΩ, and the reference voltage Vref=1.25 V.

Since the reference voltage for AD conversion is common to the reference voltage Vref=1.25 V applied to the thermistors 27 and 28, the ratios between the numerical value of the result of the AD conversion and the full-scale value of the AD conversion represent the divided voltage ratios P1 and P2 regardless of the value of the reference voltage. When the ratios are multiplied by the resistance value RL1=RL2=10 kΩ of the load resistance, the resistance values Rth1 and Rth2 of the thermistors 27 and 28 are obtained.

The processor 35 includes a central processing unit (CPU). The processor 35 controls each unit of the liquid ejecting device 1 to realize various functions of the liquid ejecting device 1 according to the operating system and the application program.

The processor 35 controls the drive circuit 26*a* of the liquid ejecting head 10 via the control circuit 38. The control circuit 38 includes a switch element SW1 that controls whether or not to apply the drive power source 1 to the power source 1 of the drive circuit 26*a* of the liquid ejecting head 10, a switch element SW2 that controls whether or not to apply the drive power source 2 to the power source 2 of the drive circuit 26*a* of the liquid ejecting head 10, and a control output that gives a control signal to a control input that controls the drive circuit 26*a*. The control circuit 38 operates by a drive power source 1.

The power source 1 (for example, 5 V) and a power source 2 (for example, 15 V to 30 V) are applied to the drive circuit 26*a* via SW1 and SW2. The power source 1 is a power source used for controlling the operation of the drive circuit 26*a* and the power source 2 is a power source used as a drive voltage to be applied from the drive circuit 26*a* to the actuator 23*a*.

The processor 35 is connected to various drive mechanisms and controls the operation of each unit of the liquid ejecting device 1 via each control circuit 38 and the drive circuit 26*a*. The processor 35 is connected to various sensors including the first thermistor 27 and the second thermistor 28, and the detected information is fetched by the A/D conversion circuit 37.

The processor 35 executes control processing based on a control program previously stored in the memory 36, thus the processor 35 controls the printing operation by controlling the operations of the liquid ejecting head 10 and the circulation pump 16, for example. At this time, the processor 35 controls the temperature control device 11*a* based on the data measured by the first thermistor 27 and the second thermistor 28, and also controls the temperature management and the drive power source voltage.

The memory 36 is, for example, a nonvolatile memory 36 and is mounted on the control board 18. Various control programs and operation conditions are stored in the memory 36 as information required for control of ink circulation operation, ink supply operation, temperature control, liquid level management, pressure control, on/off control of the drive power sources 1 and 2 to the liquid ejecting head 10, voltage control of the drive power source 2, and the like.

In the liquid ejecting device 1, as printing processing of ejecting liquid such as a coating material or an ejection material from a nozzle 22*a* and performing printing, when the processor 35 detects an input instructing the start of printing, the processor 35 controls the operations of the liquid ejecting head 10 and the moving mechanism according to various programs and performs a liquid droplet ejection operation.

Upon initialization of the control board 18, by monitoring the first thermistor 27 and the second thermistor 28 prior to applying the drive voltage to the liquid ejecting head 10, the processor 35 detects the presence or absence of the connection between the fitting terminal portion 31*a* and the first FPC connector 29 and the connection between the fitting terminal portion 31*b* and the control side FPC connector 18*a*.

The control of the processor 35 will be described below with reference to the circuit diagram of FIG. 6 and the flowchart of FIG. 7.

In the initial state of the control board 18, the switch elements SW1 and SW2 of the control circuit 38 are off, and in the initial state, no control output is also given. Accordingly, the initial state starts from a state where all of the power source 1, the power source 2, and the control input are not given to the liquid ejecting head 10.

Upon initialization of the control board 18, for example, as Act 1, the processor 35 detects the resistance values Rth1 and Rth2 of the two thermistors 27 and 28 prior to the supply of the power source 1 and the power source 2 to the liquid ejecting head 10.

Here, for example, when the detection voltage of IN1=P1·Vref, the detection voltage of IN2=P2·Vref, and P1 and P2 are the voltage division ratios, Rth1=(P1/(1−P1))·RL1, Rth2=(P2/(1−P2))·RL2, and the resistance values Rth1 and Rth2 are obtained from the divided voltage ratios P1 and P2 by these equations.

In Act 2, the processor 35 determines whether or not the resistance values Rth1, Rth2 are within a normal range. The normal range is set based on, for example, a standard that the connection state of the liquid ejecting head 10 is normal, and is a value that is considered to be abnormal in connection when exceeding the normal range. For example, R is in the range of 1 kΩ or more and 100 kΩ or less in the normal range. That is, when R>100 kΩ or R<1 kΩ, the processor 35 informs the user that the fitting abnormality of the FPC 31 is suspected, in particular. The fitting between the fitting terminal portion 31*a* and the first FPC connector 29 and the fitting between the fitting terminal portion 31*b* and the control side FPC connector 18*a* are manually performed. For example, as shown in FIG. 5B, when the fitting between the fitting terminal portion 31*a* and the first FPC connector 29 is inclined, or when the fitting between the fitting terminal portion 31*b* and the control side FPC connector 18*a* is inclined, at least one of the connection states of the thermistor terminals at both ends becomes an open or short circuit state and is detected as a connection abnormality. In a state in which the fitting is inclined as shown in FIG. 5B, the terminal portion of the FPC 31 may be further fitted to the first FPC connector 29 with being biased in the X direction. In such a case, for example, the signal line 32*b* is normal and an open or short circuit occurs at the signal line 32*a*, or conversely, the signal line 32*a* is normal and an open or short circuit occurs at the signal line 32*b*. Even in such a case, it is preferable to check both the resistance values Rth1 and Rth2 of the two thermistors 27 and 28 connected by the signal line 32*a* and the signal line 32*b* in order to reliably detect the fitting abnormality. If the fitted state is normal as shown in FIG. 5A, the connection abnormality is not detected.

In Act 2, if the fitted state is out of the normal range (No in Act 2), the processor 35 displays a connection error as Act 3.

When the processor 35 determines that the fitted state is within the normal range (Yes in Act 2), in Act 4, the switches SW1 and SW2 are sequentially turned on, the drive power sources 1 and 2 are sequentially applied to the drive circuit 26*a*, then the control signal is output from the control output so as to initialize the drive circuit 26*a* (Act 5) and standby for printing (Act 6).

Further, the processor 35 detects the resistance values Rth1 and Rth2 of the two thermistors 27 and 28 as Act 7, performs predetermined calculation processing, and calculates temperatures T1 and T2 (Act 8).

Here, an example temperature T (° C.) is given by the following equations.

$$T_1 = \frac{1}{\frac{l_{og}(R_{th1}/R25)}{B} + \frac{1}{298}} - 273\ (°\ \mathrm{C.}) \quad \text{[Equation 1]}$$

-continued $$T_2 = \frac{1}{\frac{l_{og}(R_{th2}/R25)}{B} + \frac{1}{298}} - 273\ (°\ \mathrm{C.}) \quad \text{[Equation 2]}$$

To obtain the temperatures T1 and T2 from the resistance values Rth1 and Rth2 of the first thermistor 27 and the second thermistor 28, the logarithmic function calculation may be sequentially performed, but the relationship between Rth1, Rth2, T1, and T2 may be stored in advance in the memory 36 as a table and this table may be referred to according to the detected Rth1 and Rth2. Instead of using the table of the relationship between Rth1, Rth2, T1, and T2, the relationship between the divided voltage ratios P1 and P2 and the temperatures T1 and T2 may be directly set as a table.

In Act 1 and Act 7, the processor 35 acquires the voltage obtained by dividing the reference voltage Vref by the load resistors RL1 and RL2 and the resistance values Rth1 and Rth2 of the thermistors 27 and 28 by the A/D conversion circuit 37 and obtains the resistance values of the thermistors 27 and 28 from the ratio between the numerical value of the result of the AD conversion and the full-scale value of the AD conversion as described above. Once the resistance values of the thermistors 27 and 28 are obtained, the temperatures T1 and T2 of the thermistors 27 and 28 may be determined by the above equations.

The reference voltage Vref for AD conversion and the power source for the drive circuit 26*a* are independent. For this reason, the temperatures may be measured by the thermistors 27 and 28 even in a state in which power is not supplied to the drive circuit 26*a*.

As Act 9, the processor 35 checks whether or not the temperatures T1 and T2 measured by the two thermistors 27 and 28 are within respective allowable ranges thereof.

For example, the allowable range of the second thermistor representing the temperature of the liquid is 25° C. to 50° C. The lower temperature limit of 25° C. is derived from the upper limit of the viscosity of the ejectable liquid and the upper-temperature limit of 50° C. is derived from the lower limit of the ejectable liquid viscosity. The allowable range of the first thermistor representing the temperature inside the housing 21 is a stop reference value. When any one of the temperatures measured by the two thermistors 27 and 28 exceeds the allowable ranges, printing is not performed but waits until the temperatures fall within the allowable ranges. Act 10 indicates that the temperatures measured by the two thermistors 27 and 28 are out of the allowable ranges. For example, by displaying whether the temperature of the liquid is higher than the allowable range or lower than the allowable range, or the head temperature in the housing 21 is higher than the allowable range on the display device 14*b* of the interface unit 14, notification processing is performed.

Here, a stop reference value that determines an allowable range of the first thermistor will be described. Since the temperature inside the casing of the liquid ejecting head 10 rises due to the heat generated by the drive circuit 26 a during printing, when the temperature or the output in the case of the liquid ejecting head 10 measured by the first thermistor 27 exceeds the stop reference value, it is determined that the drive circuit 26*a* is at a high temperature, and the printing process is controlled to be paused until it falls below the stop reference value of the recovery which is the fourth reference value.

Generally, the heat generation amount of the actuator 23*a* and the drive circuit 26*a* is proportional to the number of times of driving, and the heat generation of the actuator 23*a* is transmitted to the ink. Therefore, if the frequency of driving is high, the temperature of the actuator 23*a*, the ink, and the drive circuit 26*a* also rises. In the ink circulation-type head, the temperature of the ink is heated or cooled at a portion outside the liquid ejecting head 10 of the ink circulation path 15 regardless of the number of times of the actuator 23*a* is driven. For example, the ink tank 11 outside the liquid ejecting head 10 may be heated or cooled by the temperature control device 11*a*. Even without an active temperature control of the ink tank 11 outside the liquid ejecting head 10 by the temperature control device 11*a*, if a volume of an ink tank in the circulation path 15 is large, ink having a temperature higher than a room temperature is cooled toward the room temperature. Since the heat capacity of the ink is large, when the ink is cooled or heated, the actuator 23*a* is cooled or heated by the ink and varies according to the temperature of the ink. However, since the drive circuit 26*a* is not in direct contact with the ink, the drive circuit 26*a* is hardly affected by the temperature of the ink, and the temperature rises in proportion to the number of times of driving. As a result, a temperature difference increases between the ink and the drive circuit 26*a*. In the example embodiments described herein, the first thermistor 27 is used to correctly determine whether or not the temperature of the drive circuit 26*a* has exceeded, separately from the temperature of the ink.

For example, the stop reference value is set to a value that may cause failures such as breakage of the drive circuit 26*a* if printing is continued any further. Here, as an example, the stop reference value is set to 75° C., and the recovery reference value is set to 70° C. That is, when the temperature measured and calculated by the first thermistor 27 exceeds 75° C. or when the resistance value is $R<1.9$ kΩ, printing is controlled to be stopped until the temperature falls below 70° C. or the resistance value reaches $R>2.2$ kΩ. At this time, the processor 35 detects a print content to be printed subsequently and determines a size of the print content, and only when a predetermined continuation condition that a small amount of heat generation will be generated is satisfied, printing may be allowed to continue.

In Act 9, when both the temperatures T1 and T2 of the two thermistors 27 and 28 are within the respective allowable ranges (Yes in Act 9), the processor 35 determines whether or not a print start command has been detected (Act 11), and once the print start command has been, the processor 35 sets the voltage of the drive power source 2 according to the temperature T2 (Act 12) and performs the printing processing (Act 13). Here, the processor 35 changes the magnitude of the voltage of the drive power source 2 in accordance with the temperature T2 of the liquid measured by the second thermistor 28. That is, when the temperature T2 of the liquid measured by the second thermistor 28 is low, since the viscosity is high and the efficiency of the actuator 23*a* is low, the drive voltage applied to the actuator 23*a* is increased by increasing the voltage of the drive power source 2. Conversely, when the temperature T2 of the liquid is high, since the viscosity is low and the efficiency of the actuator 23*a* is high, the drive voltage applied to the actuator 23*a* is controlled to be low by lowering the voltage of the drive power source 2. That is, an appropriate drive voltage corresponding to the viscosity of the liquid with respect to the change within the allowable range of the temperature T2 is applied to the drive circuit 26*a* to stabilize the ejection characteristics of the liquid ejecting head 10. A predetermined table is stored in the memory 36 for the relationship between the temperature T2 and the voltage of the drive power source 2, and the processor 35 refers to the table in accordance with the temperature T2.

Specifically, as printing processing, the processor drives the actuator 23*a* of the actuator unit 23 to eject the liquid from the liquid ejecting head 10. An image is formed on the recording medium by ejecting the liquid in a state in which the recording medium is disposed at the printing position by the moving mechanism (not specifically shown). After entering the print standby state at Act 6, the circulation pump 16 continuously operates. That is, the ink is continuously circulated. Even when the temperature T2 deviates from the allowable range at Act 9, while waiting in a loop including Act 10, the temperature T2 may return to the allowable range as the ink circulates. In the liquid ejecting head and the liquid ejecting device according to the example embodiments described herein, two thermistors 27 and 28 are provided as temperature sensors to measure the temperature inside the housing and the temperature of the flow path on the downstream side of the actuator 23*a* or the actuator 23*a*. Therefore, even when the temperature of the liquid changes due to heating or cooling of the liquid in the circulation-type liquid ejecting head, the accurate temperature of the drive circuit 26*a* may be measured. Therefore, overheating of the drive circuit may be prevented, and the liquid temperature may be kept appropriate.

In addition, by setting the terminal assignments for the signal lines of the two thermistors on the FPC 31 at both ends of the FPC 31, it is possible to detect a connector fitting misalignment and the oblique insertion of the FPC 31 without increasing the cost. That is, even if only one of the connectors is defective due to misaligned or oblique insertion, it is possible to accurately detect a connection failure because resistance values of the thermistors 27 and 28 assigned to terminals at opposite sides of the FPC 31 will become abnormal. In general, an AD converter is used for signal measurement from thermistors, however in the example embodiments described herein, the AD conversion may also be used for detecting oblique insertion of a FPC connector. Therefore, by using AD conversion to acquire an analog value rather than just receiving a digital signal at the terminal, it is possible to reliably detect a connection failure even if the open or short-circuit state between terminals is incomplete or partial.

The liquid ejecting head and the liquid ejecting device according to the example embodiments described herein will not fully power-on when the analog value is outside of a first reference range, and a connection failure can be reported to protect the drive circuit 26*a* when the analog value exceeds a second reference range. Thus, it is possible to avoid a failure of the liquid ejecting head 10 due to poor or faulty connections.

Further, as shown in FIG. 6, a reference power source for AD conversion used for detecting the resistance of the thermistors 27 and 28 is set to be independent of the power source that is applied to the drive circuit 26*a*. That is, an operating current for the drive circuit 26*a* is not passed through the measurement paths of the thermistors 27 and 28, and the ground and the drive circuit 26*a* are distinguished and not shared. Therefore, since the detection circuit of the thermistors 27 and 28 is not affected by the drive circuit 26*a*, the reference power source may be a low-voltage and high-impedance power source. By making it possible to perform oblique insertion detection before applying a power source to the drive circuit 26*a*, it is possible for the controller to detect the oblique insertion prior to turning on the power and thus prevent the power source from being turned on if there is oblique insertion. As a result, it is possible to provide a liquid ejecting head 10 that is protected even against accidental oblique insertion.

To prevent the destruction of the drive circuit due to overheating, a method of directly measuring the temperature of the drive circuit is also conceivable. However, in such case, if there is a plurality of drive circuits, a matching number of temperature sensors are required. In addition, the mounting structure of the drive circuits becomes complicated. However, in the example embodiments described herein, since the thermistors are mounted on a circuit board as discrete chip components, relatively inexpensive additional chip components may be mounted with a small number of steps, and the drive circuit may be protected inexpensively.

It should be noted that the particular example embodiments described above are just some possible examples of a liquid ejecting device according to the present disclosure and do not limit the possible configurations, specifications, or the like of liquid ejecting devices according to the present disclosure. For example, the mounting positions of the temperature sensors are not limited to the particular positions described above. For example, it is preferable that one of the temperature sensors is at a position where heat generation of the drive circuit may be detected on the circuit board, and the other temperature sensor is in the flow path on the downstream side of the actuator or the actuator and is disposed at a position where the temperature of the liquid may be measured. For example, the second thermistor 28 may be provided so as to be in contact with the actuator unit 23 instead of the flow path on the collection side.

The reference temperature range may be appropriately changed according to various expected operating conditions.

The wiring connection element connecting the circuit board 26 and the control board 18 is not limited to the FPC 31 described above. For example, it is possible to use another wiring connection element such as a flat copper conductor (FFC) card electric wire obtained by laminating a portion excluding the connection terminal portions on both longitudinal ends of a plurality of ribbon-shaped copper foil wires with a film. Even in this case, it is still possible to detect a connection abnormality from the measurement values of both sensors by assigning the terminals on both sides that are apart from each other in the width direction to the first and second temperature sensors, respectively.

The liquid to be ejected is not limited to ink, and liquids other than ink may be ejected. As an example of a liquid ejecting device that ejects liquids other than ink, a device that ejects a liquid containing conductive particles used for forming a wiring pattern on a printed wiring board, or the like may be used.

The liquid ejecting head 10 may have a structure in which ink droplets are ejected by deforming the diaphragm with electricity, a structure in which ink droplets are ejected from a nozzle using thermal energy of a heater, or the like.

In general, the example embodiments described above are applied to a liquid ejecting device in an ink jet recording device, such as a paper printer. However, the present disclosure is not limited to use in this particular application. The liquid ejecting device may also be used, for example, in 3D printers, industrial manufacturing machines, and medical applications and may reduce a size, weight, and/or cost of such liquid ejecting devices.

While certain embodiments have been described, these embodiments have been presented by way of example only, and are not intended to limit the scope of the present disclosure. Indeed, the novel embodiments described herein may be embodied in a variety of other forms. Furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A liquid ejecting device, comprising:

an actuator communicating with a nozzle and configured to eject liquid from the nozzle;

a drive circuit configured to drive the actuator;

a flow path of liquid circulating;

a wiring connector on a circuit board having a plurality of terminals;

a first temperature sensor configured to measure a temperature on a surface on the circuit board proximate to the drive circuit and connected to a first terminal of the plurality of terminals;

a second temperature sensor configured to measure a temperature of a liquid on the flow path of liquid circulating and connected to a second terminal of the plurality of terminals; and a control board configured to:

stop a printing operation if a first temperature value determined based on a signal supplied via the first terminal is outside of a first predetermined allowable range, not apply a drive voltage to the drive circuit if a second temperature value determined based on a signal supplied via the second terminal is outside of a second predetermined allowable range and the first temperature value is within the first predetermined allowable range, and apply a drive voltage to the drive circuit if the second temperature value is within the second predetermined allowable range and the first temperature value is within the first predetermined allowable range.

2. The liquid ejecting device according to claim 1, wherein the control board is further configured to perform a notification processing when the first temperature value is outside of the first predetermined allowable range or the second temperature value is outside of the second predetermined allowable range.

3. The liquid ejecting device according to claim 1, wherein the flow path passes through the actuator and is connectable to an external liquid storage tank.

4. The liquid ejecting device according to claim 3, wherein the liquid is heated or cooled in the flow path proximate to the external liquid storage tank.

5. The liquid ejecting device according to claim 3, wherein the second temperature sensor is on a collection pipe on the downstream side of the actuator, and the collection pipe comprises a thermal conductive pipe and a tube covering an outer surface of the pipe.

6. The liquid ejecting device according to claim 3, wherein the first temperature sensor is closer to the drive circuit than the second temperature sensor is to the drive circuit.

7. The liquid ejecting device according to claim 3, wherein the first and second temperature sensors are thermistors.

* * * * *